United States Patent [19]

Lee

[11] 3,885,173

[45] May 20, 1975

[54] APPARATUS AND METHOD FOR COUPLING AN ACOUSTICAL SURFACE WAVE DEVICE TO AN ELECTRONIC CIRCUIT

[75] Inventor: Lawrence L. Lee, Fort Wayne, Ind.

[73] Assignee: The Magnavox Company, Fort Wayne, Ind.

[22] Filed: Oct. 9, 1973

[21] Appl. No.: 404,456

[52] U.S. Cl. .............. 310/9.4; 174/DIG. 3; 310/8.2; 310/8.9; 310/9.8; 317/101 CC; 333/30 R; 339/17 CF

[51] Int. Cl. .............. H01v 7/00

[58] Field of Search .............. 29/25.35; 310/8.2, 8.9, 310/9.1–9.4, 9.7, 9.8; 333/30 R, 72; 174/50.54, 50.62, 52, DIG. 3, 101 CC; 339/17 CF

[56] References Cited

UNITED STATES PATENTS

| | | | |
|---|---|---|---|
| 3,453,458 | 7/1969 | Curran et al. | 310/9.8 X |
| 3,488,530 | 1/1970 | Staudte | 310/9.1 |
| 3,527,967 | 9/1970 | Dyer et al. | 310/9.4 X |
| 3,596,212 | 7/1971 | Werner et al. | 310/9.4 X |
| 3,694,674 | 9/1972 | Inoue | 310/9.4 X |

*Primary Examiner*—Mark O. Budd
*Attorney, Agent, or Firm*—Thomas A. Briody; William J. Streeter; Joe E. Barbee

[57] ABSTRACT

Apparatus and method for mechanically and electrically coupling an acoustical surface wave device to an electronic circuit. The apparatus includes a gasket and a housing. The gasket, comprised of a resilient material having conducting regions, provides electrical coupling between, while physically separating, the electronic circuit and the surface wave device. The housing locates the gasket relative to the surface wave device and to the electronic circuit so that preselected regions of conductivity of the assembly are adjacent. The housing further provides mechanical coupling of the surface wave device and the gasket to the electronic circuit and, by exerting sufficient force to compress the gasket, assures electrical coupling between the adjacent conducting regions. The gasket, disposed around the periphery of the surface wave device, damps acoustical surface waves reaching the periphery, thereby reducing edge-reflected acoustic surface waves, while not affecting the production and propagation of desired surface wave components. The gasket further acts as a seal, protecting the active portion of the surface wave device.

14 Claims, 3 Drawing Figures

APPARATUS AND METHOD FOR COUPLING AN ACOUSTICAL SURFACE WAVE DEVICE TO AN ELECTRONIC CIRCUIT

BACKGROUND OF THE INVENTION

1. Field of the Invention

This invention relates to acoustic wave devices and more particularly to the coupling of surface wave devices to electronic circuits. According to one embodiment of the invention, the surface wave device can be detachably mounted to an electronic circuit disposed on a circuit board. According to another embodiment of the invention, the surface wave device can be incorporated into an electronic component and the component coupled to an electronic circuit by means typically utilized for this purpose.

2. Description of the Prior Art

The incorporation of surface wave devices into electronic circuits has been accomplished in the prior art by attaching conducting leads from the electronic circuits to conducting electrodes on a piezoelectric substrate. Methods of attaching the conducting leads have included the use of conductive epoxy cement, soldering and ultrasonic bonding. In each case, the procedure for the attachment of the conductive leads is expensive and inconvenient. In addition, the replacement of the surface device in the electronic circuit is hampered because of the permanent nature of the attachment process. Furthermore, the conducting electrodes are structurally weak and can be separated from the substrate. To increase the structural integrity of the surface wave device, encapsulation techniques have been employed. However, the encapsulation techniques, while providing desirable environmental protection for the surface wave device, further increases the expense and inconvenience of fabrication, especially in view of the requirement that contact should not be made with the active portion of the surface wave device.

To provide flexibility in the coupling of a surface wave device to an electronic circuit, the surface wave device can be incorporated in an electronic component package having a standard configuration with the socket matching the electronic element package coupled directly to the electronic circuit. While a component package increases the convenience of coupling and uncoupling of the surface wave device from the electronic circuit, the expense and inconvenience of attaching conducting leads to the surface wave device electrodes is found in the fabrication of the package. Furthermore, it can be desirable to be able to replace conveniently the surface wave device in the electronic component package.

It is therefore an object of the present invention to provide for improved electronic circuits using surface wave devices.

It is another object of the present invention to provide a method of detachably mounting surface wave devices to electronic circuits.

It is still another object of the present invention to provide improved method and apparatus for incorporating surface wave devices in electronic component packages.

It is a further object of the present invention to couple directly surface wave devices to electrical circuits and into component packages without attaching electrical leads to conducting regions of the surface wave device.

It is a further object of the present invention to couple directly surface wave devices to electrical circuits or to component packages without requiring further processing or fabrication of the surface wave device.

It is a more particular object of the present invention to provide a gasket containing conducting regions for electrically coupling an electronic circuit conductors with conducting regions of a surface wave device.

It is still a more particular object of the present invention to provide a gasket and a housing which permits electrical coupling of a surface wave device to electrical conductions and which furnishes environmental protection for the surface wave device.

It is another particular object of the present invention to provide a means of damping acoustic surface waves leaving the active region of the surface wave device.

SUMMARY OF THE INVENTION

The aforementioned and other objects of the present invention are accomplished by providing a housing and a compressible gasket by which a surface wave device is mechanically and electrically coupled to an electronic circuit. The housing compresses the gasket between the surface wave device and a region which includes conductors coupled to the electronic circuit, so that the assembly is positioned securely. Conducting regions of the gasket are simultaneously positioned adjacent to preselected regions of the surface wave device and the conductors coupled to the electronic circuits. The compression of the gasket ensures contact and therefore electrical coupling between the conduction regions of the gasket and adjacent regions.

The gasket further damps accoustic surface waves reaching the edge of the device thereby reducing undesired reflected surface waves. The active regions of the surface wave device are enclosed by the gasket and environment protection is provided for these regions.

These and other features of the invention will be understood upon reading of the following description along with the drawings.

DESCRIPTION OF THE PREFERRED EMBODIMENT

Detailed Description of the Figures

Figure 1:
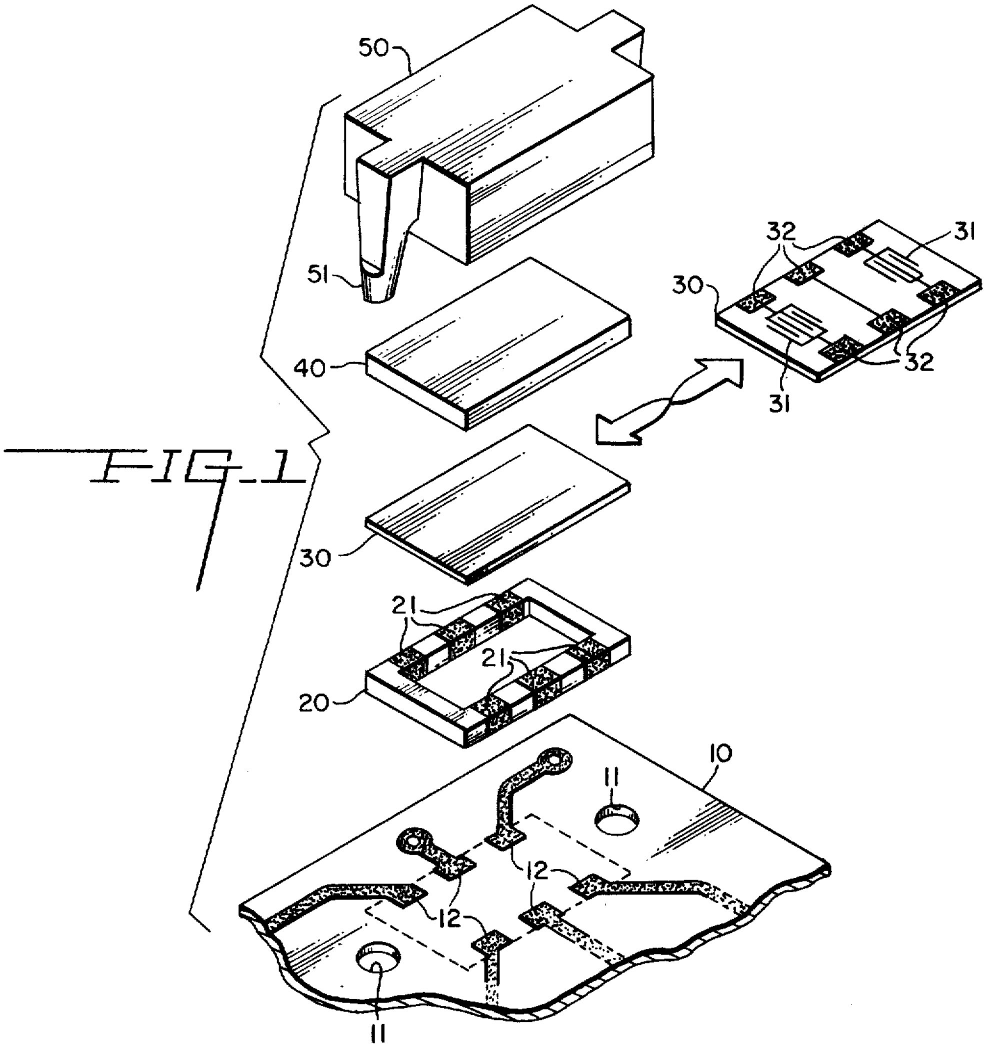
FIG. 1 is an exploded view of an assembly coupling a surface wave device to a printed circuit board according to a first embodiment.

Referring now to FIG. 1 showing a first embodiment of the invention, a Printed Circuit Board 10 is provided with preselected Conducting Regions 12 extending from the electronic circuit and with Apertures 11 located in preselected positions relative to Conducting Regions 12. A Gasket 20 is located adjacent to the preselected Conducting Regions 12 of the Printed Circuit Board 10. Gasket 20 is fabricated from a resilient insulating material, but includes Conduction Regions 21. In the preferred embodiments, the gasket is fabricated from silicone rubber, the regions of conduction provided by the impregnation of the silicone rubber with silver; however, other materials can be used. The Conducting Regions 21 are located adjacent to the Conducting Regions 12 of the Printed Circuit Board 10.

A Surface Wave Device 30 is located in contact with the Gasket 20. Conducting Electrodes 32 coupled to active Surface Wave Circuit Elements 31 are positioned so as to be adjacent with the Conducting Regions 21 of the Gasket.

In the first embodiment, a Backing Pad 40, fabricated from silicone rubber, is placed adjacent to the Surface Wave Device 30 and Housing 50 is placed adjacent to the Backing Pad 40. Extending from Housing 50, Spring Pins 51 can be attached to Apertures 11 of the Printed Circuit Board 10. In the first embodiment, Housing 50 is fabricated from plastic, but other materials can be used. For example, portions of Housing 50 can be fabricated from metal and coupled to ground to shield the surface wave device from undesired electrical signals. The Spring Pins 51 which attach Housing 50 to Printed Circuit Board 10 in the preferred embodiment can be replaced by other means for attachment, such as self-threading screws, as will be apparent to one skilled in the art. The Backing Pad 40, which is used to distribute pressure on the surface wave device, can be eliminated by proper fabrication of Housing 50, and the Housing 50 itself used to apply pressure to the Surface Wave Device 30.

Figure 2:
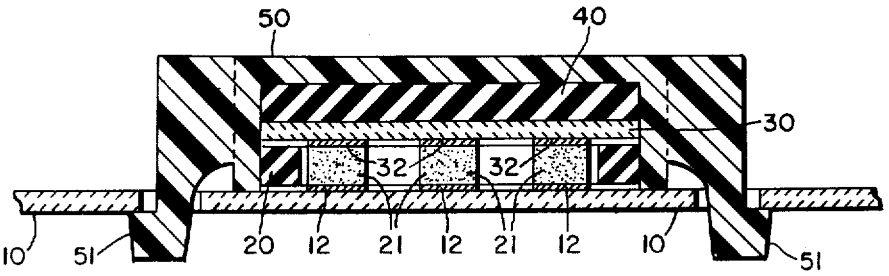
FIG. 2 is cross-sectional view of the assembly coupling a surface wave device to a printed circuit board according to the first embodiment.

Referring next to FIG. 2, the coupling of the Surface Wave Device 30 to the electronic circuit on a Printed Circuit Board 10 according to the first embodiment is shown in a cross-sectional view. The Spring Pins 51, located in Apertures 11, locate and secure the Housing 50 to the Printed Circuit Board 10. The Conducting Regions 32 of the Surface Wave Device 30 are in electrical contact with the Conducting Regions 21 of Gasket 20. The Conducting Regions of the Gasket in turn are in electrical contact with Conducting Regions 12 of the Printed Circuit Board 10. The Backing Pad 40 is located between the Housing 50 and the Surface Wave Device 30, and the Gasket 20 is located between Surface Wave Device 30 and the Printed Circuit Board 10.

Figure 3:
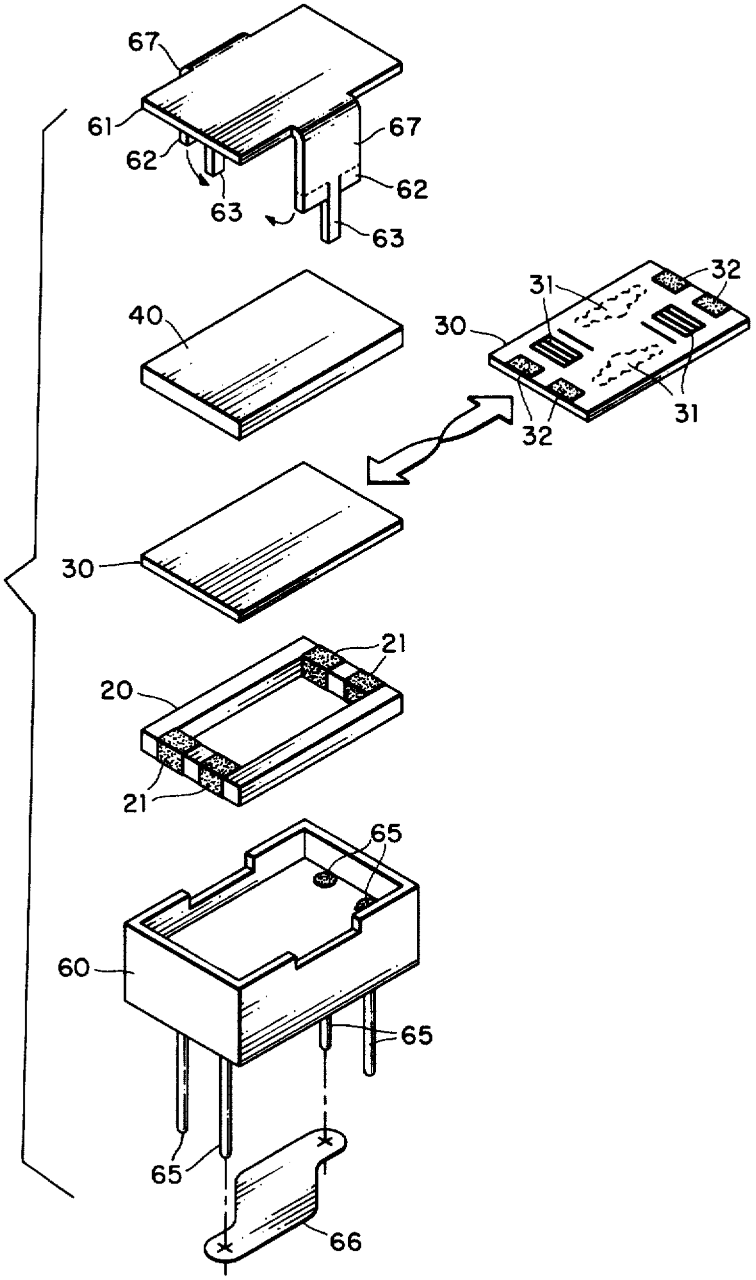
FIG. 3 is an exploded view of a second embodiment of the invention in which the surface wave device is incorporated in an electronic component package.

Referring next to FIG. 3, a second embodiment of the invention is shown in which a surface wave device is incorporated in an electronic component package. Component Package 60 includes Conducting Pins 65 extending from the base. The Conducting Pins 65 are located so that the Component Package can be inserted in a receptacle coupled to the electronic circuit. The Conducting Pins 65 are exposed in the interior region of Component Package 60.

Gasket 20 is located in the interior region of Component Package 60. Conducting Regions 21 of the Gasket 20 are positioned adjacent to the Conducting Pins 65. A Base Projection 68 can be formed on the interior base of Component Package 60 to position Gasket 20. The Surface Wave Device 30, containing Conducting Electrodes 32 coupled to active Surface Wave Elements 31, is so positioned in relation to Gasket 20 that Conducting Electrodes 32 are adjacent to Conducting Regions 21. A compressible Backing Pad 40 is positioned adjacent to the Surface Wave Device 30. The function of Backing Pad 40 is to distribute pressure to be exerted on the Surface Wave Device 30, and, in addition, can be fabricated of a conducting material, e.g. silver-impregnated silicone rubber, to provide a shield against undesired electromagnetic radiation. The Backing Pad 40 can also be omitted as will be apparent to one skilled in the art. Housing 61 is located adjacent to Backing Pad 40 or, when the Backing Pad is omitted, adjacent to the Surface Wave Device 30. When the Housing 61 is in position, pressure is exerted on the Surface Wave Device 30 and Gasket 20 is compressed.

Housing 61 has been fabricated from a conducting material to provide a shield against undesired radiation; however, other materials can be used as will be apparent to one skilled in the art. Another radiation shield Ground Plate 66 is coupled mechanically and electrically to Conducting Pins 65 at ground potential. Ground Plate 66 extends along the exterior base of Housing 61. Housing Arms 67 of Housing 61 project along exterior sides of Component Package 60. Projections 62 of Housing Arms 67 are bent under the exterior base of Component Package 60 and are placed in contact with Ground Plate 66. Housing Fingers 63 project into socket connections which are maintained at ground potential. Housing Fingers 63 can be omitted and the ground potential can be maintained by means of the preselected Conducting Pins 65. Another possible variation is to omit the Ground Plate 66 when the Housing Fingers 63 provide the ground potential for the Housing 61.

Operation of the Preferred Embodiments

In the first embodiment of the invention, the electrical coupling of the Surface Wave Device 30 to the Printed Circuit Board 10 requires that the Conducting Regions 21 of the Gasket 20 provide electrical coupling between Conducting Regions 12 of the Printed Circuit Board 10 and the Conducting Regions 32 of the Surface Wave Device 30. Housing 50 in combination with Apertures 11 of the Printed Circuit Board 10 provides the mechanism for locating the respective Conducting Regions of the Gasket, Surface Wave Device, and Printed Circuit Board relative to one another. Gasket 20 and Surface Wave Device 30 are located in the interior of Housing 10 and are thus positioned relative to the Housing while the location of Apertures 11 and Spring Pins 51 locate the Housing relative to the Printed Circuit Board, thus resulting in the correct positioning of the elements. When the Housing 10 is in position, the Gasket 20 is compressed between Surface Wave Device 30 and the Printed Circuit Board 10. Adjacent regions of conductivity are forced together providing an electrical contact. In this manner, the Surface Wave Device is electrically coupled to the electronic circuit of the printed circuit board and the Surface Wave Device properties use to manipulate electronic signals, e.g., as a filter.

The first embodiment provides for the detachable mounting of a surface wave device to a printed circuit board. However, one skilled in the art will easily understand that the Surface Wave Device could be attached to the Printed Circuit Board 10, for example, by melting the plastic of the Spring Pins 51 in Apertures 11.

In the embodiment of the invention shown in FIG. 3, the Housing 61 is employed to compress Gasket 20 and provide an electrical contact between Conducting Regions 21 of the Gasket and adjacent conducting regions located on the Surface Wave Device 30 and in the base of the Component Package 60. The relative positions of the Surface Wave Device 30 and the Gasket 20 are determined by the interior geometry of the Component Package. The Surface Wave Device is therefore coupled in an electronic circuit by inserting the Component Package into a socket whose terminals have been coupled in an appropriate manner to the electronic circuit. By means apparent to those skilled in the art, the Housing 61 can be permanently sealed to the Component Package or can be removably attached to the Component Package depending, for example, on the desirability of removing the Surface Wave Device.

The Gasket 20, disposed along the periphery of the Surface Wave Device, reduces the effect of edge-reflected acoustic surface wave by damping the surface waves reaching the edge. It is known in the art to reduce the effect of edge-reflected waves by using a Surface Wave Device substrate with other than rectangular geometry. It is apparent that the present invention can be easily adapted to other geometries. The Gasket 20 also provides environmental protection to the active elements of the Surface Wave Device, sealing the active elements between the substrate of the Surface Wave Device and the Printed Circuit Board in the first embodiment, or between the substrate of the Surface Wave Device and the base of the Component Package in the second embodiment.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. Apparatus for coupling an acoustic surface wave device to an electronic circuit, wherein said electronic circuit and said surface wave device have exposed conducting regions, comprising:

a gasket disposed between said surface wave device and said electronic circuit, said gasket comprised of an acoustic surface wave absorbing material, said gasket including a plurality of conducting regions;

a housing for containing said gasket and said surface wave device, said housing locating preselected conducting regions of said gasket adjacent to preselected exposed conducting regions of said surface wave device, said gasket being disposed about a region of said surface wave device containing active elements, said gasket damping acoustic surface waves propagated in a vicinity of said gasket; and means for coupling said housing to said electronic circuit, said coupling means locating predetermined conducting regions of said gasket adjacent to preselected exposed conducting regions of said electronic circuit.

2. The apparatus of claim 1 wherein said gasket is comprised of a compressible material, said coupling means compressing said gasket between said surface wave device and said electronic circuit.

3. The apparatus of claim 2 wherein said electronic circuit is a printed circuit, wherein said exposed electronic circuit conducting regions are associated with a structural member, wherein active elements of said surface wave device are located in a chamber formed by a substrate of said surface wave device, said structural member and said gasket.

4. The apparatus of claim 3 wherein said coupling means includes pins associated with said housing; said pins formed to be detachably secured in apertures in preestablished positions in said structural member.

5. An assembly, for utilizing acoustic surface wave properties in an electronic circuit, comprising:

an acoustic surface wave device, said device including exposed conducting regions coupled to active surface wave elements;

a gasket comprised of a compressible material, said gasket including a plurality of conducting regions wherein said gasket is disposed around said surface wave device active elements for damping acoustic surface waves arriving in the vicinity of said gasket, wherein preselected gasket conducting regions are located adjacent to predetermined surface wave device conducting regions;

a structural member including means for electronically coupling to said electronic circuit, said structural member including conducting regions coupled to said electronic coupling means, wherein predetermined member conducting regions are located adjacent to said preselected gasket conducting regions, wherein said surface wave device active elements are located in a chamber formed by a substrate of said surface wave device, said structural member and said gasket; and a housing, said housing including means for coupling to said structural member, said housing securing said gasket relative to said structural member and to said surface wave device.

6. The assembly of claim 5 wherein said structural member is a printed circuit board.

7. A method of coupling a surface wave device to an electronic circuit comprising the steps of:

disposing a gasket about an active region of said surface wave device, said gasket damping acoustic surface waves in the vicinity of gasket;

positioning said gasket comprised of a compressible acoustic wave absorbing material in such a manner that a plurality of conducting regions of said gasket are adjacent to predetermined conducting regions associated with a structural member and adjacent to preselected conducting regions of said surface wave device, said structural member including means for coupling said predetermined conducting regions to said electron circuit; and securing said gasket relative to said predetermined conducting regions and relative to said surface wave device by means of a housing, said housing demountably engaged by said member.

8. A component for incorporating a surface wave device in an electronic circuit, comprising:

a base member, said base member including means for electrically coupling to said electronic circuit, said base member including conducting regions electrically coupled to said electronic circuit when said coupling means is engaged;

a gasket comprised of an acoustic wave absorbing material, said gasket including a plurality of conducting regions, wherein said gasket is disposed about an electro-acoustically active region of said surface wave device, said gasket damping acoustic surface waves propagated from said active region, said gasket conducting regions adjacent to preselected base conducting regions when said surface wave device is in predetermined position, said gasket conducting regions are adjacent to conducting regions of said surface wave device when said surface wave device is in said predetermined position; and a housing, said housing including means for coupling to said base, said housing securing said surface wave device and said gasket to said base member in said preselected position.

9. The component of claim 8 wherein said gasket forms a seal about an electro-acoustically active region of said surface wave device, said active region in an enclosure formed by said seal, a substrate of said surface wave device and said base.

10. An improved assembly for coupling a surface wave device to an electronic circuit, said assembly of the type having a housing for securing said surface wave device to a plurality of conducting regions associated with said electronic circuit, wherein the improvement comprises:

a compressible gasket positioned between said surface wave device and said conducting regions, said gasket including conducting regions for electrically coupling said surface wave device to said conducting regions, wherein said gasket is disposed about an electro-acoustically active region of said surface wave device, said active region enclosed in a chamber formed by a substrate of said surface wave device, said gasket and a structural member associated with said conducting regions.

11. Apparatus for coupling an acoustic surface wave device to an electronic circuit comprising:

a base member, said base member including conducting regions in an interior location;

means for coupling said conducting regions to said electronic circuit;

a gasket for separating said base member and said surface wave device, said gasket comprised of an acoustic wave absorbing material, said gasket including conducting portions for electrically coupling conducting areas of said surface wave device and a plurality of said conducting regions; and a housing for securing said gasket and said surface wave device to said base.

12. The apparatus of claim 11 wherein said gasket is disposed about an electro-acoustically active region of said surface wave device, said active region being enclosed by a substrate of said surface wave device, said gasket and said base member.

13. The apparatus of claim 11 wherein said housing is comprised of a conducting material, said housing electrically coupled to said electronic circuit.

14. Apparatus for coupling an acoustic surface wave device to a base member containing conducting regions, said base member including means for coupling said conducting regions to an electronic circuit, comprising:

a compressible gasket for separating said surface wave device from said base member, said gasket comprised of an acoustic wave absorbing material, said gasket including a plurality of conducting portions at preselected positions for electrically coupling said surface wave device to said conducting regions wherein said gasket is disposed about an electro-acoustically active region of said surface wave device, said active region enclosed by a substrate of said surface wave device, said gasket, and said base member; and a housing for engaging said base member, said housing compressing said gasket between said surface wave device and said base member.

* * * * *